United States Patent
Huang et al.

(10) Patent No.: US 10,153,394 B2
(45) Date of Patent: Dec. 11, 2018

(54) SEMICONDUCTOR STRUCTURE

(71) Applicant: Genesis Photonics Inc., Tainan (TW)

(72) Inventors: Chi-Feng Huang, Tainan (TW); Ching-Liang Lin, Taoyuan (TW); Shen-Jie Wang, New Taipei (TW); Jyun-De Wu, Tainan (TW); Yu-Chu Li, Chiayi (TW); Chun-Chieh Lee, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 15/627,419

(22) Filed: Jun. 19, 2017

(65) Prior Publication Data
US 2017/0294555 A1 Oct. 12, 2017

Related U.S. Application Data

(63) Continuation-in-part of application No. 14/727,786, filed on Jun. 1, 2015, now Pat. No. 9,685,586, which
(Continued)

(30) Foreign Application Priority Data

Nov. 19, 2012 (TW) .............. 101143115 A

(51) Int. Cl.
*H01L 33/00* (2010.01)
*H01L 29/06* (2006.01)
(Continued)

(52) U.S. Cl.
CPC .............. *H01L 33/06* (2013.01); *H01L 33/12* (2013.01); *H01L 33/325* (2013.01)

(58) Field of Classification Search
CPC ......... B82Y 20/00; H01L 33/04; H01L 33/32; H01L 33/06; H01S 5/2009; H01S 5/34333; H01S 5/3407
See application file for complete search history.

(56) References Cited

U.S. PATENT DOCUMENTS 8,304,793 B2 11/2012 Yoshizumi et al.
2003/0006418 A1* 1/2003 Emerson ............. H01L 21/0237
257/79
(Continued)

FOREIGN PATENT DOCUMENTS

CN 1413358 4/2003
CN 1426119 6/2003
(Continued)

OTHER PUBLICATIONS

"Office Action of US Related Application, U.S. Appl. No. 15/499,913", dated Jun. 30, 2017, p. 1-p. 24, in which the listed references (US patent application No. 1-5) were cited.
(Continued)

*Primary Examiner* — Brian Turner
(74) *Attorney, Agent, or Firm* — JCIPRNET

(57) ABSTRACT

A semiconductor structure includes a first-type doped semiconductor layer, a light emitting layer, a second-type doped semiconductor layer comprising $Al_xIn_yGa_{1-x-y}N$ layers, at least one GaN based layer, and an ohmic contact layer. The light emitting layer is disposed on the first-type doped semiconductor layer, and the second-type doped semiconductor layer is disposed on the light emitting layer. The $Al_xIn_yGa_{1-x-y}N$ layers stacked on the light emitting layer, where $0<x<1$, $0\leq y<1$, and $0<x+y<1$, and the GaN based layer interposed between two of the $Al_xIn_yGa_{1-x-y}N$ layers, and the ohmic contact layer is disposed on the $Al_xIn_yGa_{1-x-y}N$ layers.

42 Claims, 2 Drawing Sheets

Related U.S. Application Data is a continuation of application No. 13/963,104, filed on Aug. 9, 2013, now Pat. No. 9,048,364.

(51) Int. Cl.
*H01L 33/06* (2010.01)
*H01L 33/32* (2010.01)
*H01L 31/109* (2006.01)
*H01L 33/12* (2010.01)

(56) References Cited

U.S. PATENT DOCUMENTS

| | | |
|---|---|---|
| 2003/0085409 A1 | 5/2003 | Shen et al. |
| 2004/0264533 A1 | 12/2004 | Matsumura et al. |
| 2005/0224781 A1 | 10/2005 | Kneissl et al. |
| 2005/0224835 A1 | 10/2005 | Nomura et al. |
| 2006/0118820 A1 | 6/2006 | Gaska et al. |
| 2006/0175600 A1* | 8/2006 | Sato ............... B82Y 20/00 257/14 |
| 2007/0045638 A1 | 3/2007 | Shen et al. |
| 2007/0096077 A1 | 5/2007 | Sanga et al. |
| 2007/0181869 A1 | 8/2007 | Gaska et al. |
| 2010/0142576 A1 | 6/2010 | Cohen et al. |
| 2011/0012089 A1 | 1/2011 | Khan et al. |
| 2011/0114916 A1 | 5/2011 | Yoshizumi et al. |
| 2012/0037881 A1 | 2/2012 | Kim et al. |
| 2012/0069863 A1 | 3/2012 | Sizov et al. |
| 2012/0217473 A1 | 8/2012 | Shur et al. |
| 2012/0319080 A1* | 12/2012 | Fudeta ............... H01L 33/12 257/13 |
| 2013/0161586 A1 | 6/2013 | Okuno et al. |
| 2013/0277642 A1 | 10/2013 | Kneissl et al. |
| 2014/0001438 A1* | 1/2014 | Kim ............... H01L 29/151 257/18 |
| 2014/0183446 A1 | 7/2014 | Nago et al. |
| 2015/0179881 A1 | 6/2015 | Senes et al. |
| 2015/0263228 A1 | 9/2015 | Lee et al. |
| 2016/0118531 A1 | 4/2016 | Jain et al. |
| 2016/0322533 A1 | 11/2016 | Chang et al. |
| 2017/0117438 A1 | 4/2017 | Shur et al. |

FOREIGN PATENT DOCUMENTS

| | | |
|---|---|---|
| CN | 101073160 | 11/2007 |
| CN | 101339970 | 1/2009 |
| CN | 101494265 | 7/2009 |
| CN | 101645480 | 2/2010 |
| CN | 101684549 | 3/2010 |
| CN | 101944480 | 1/2011 |
| CN | 102130425 | 7/2011 |
| CN | 102185056 | 9/2011 |
| CN | 102214739 | 10/2011 |
| CN | 102214753 | 10/2011 |
| CN | 102474076 | 5/2012 |
| CN | 102881784 | 1/2013 |
| JP | H09321389 | 12/1997 |
| JP | 2000196143 | 7/2000 |
| JP | 2008034658 | 2/2008 |
| JP | 2009016452 | 1/2009 |
| JP | 2009152448 | 7/2009 |
| JP | 2010263140 | 11/2010 |
| JP | 2011023541 | 2/2011 |
| JP | 2014103384 | 6/2014 |
| TW | 402735 | 8/2000 |
| TW | 451504 | 8/2001 |
| TW | 200908393 | 2/2009 |
| TW | 201011952 | 3/2010 |
| TW | 201135967 | 10/2011 |
| WO | 2007013257 | 2/2007 |

OTHER PUBLICATIONS

"Office Action of CN Related Application, application No. 201310029711.7", dated May 27, 2017, p. 1-p. 5, in which the listed references (foreign patent No. 1-2) were cited.

Hsin-Chiao Fang, et al., "Semiconductor Device Containing Nitrogen," Unpublished U.S. Appl. No. 15/708,162, filed Sep. 19, 2017.

"Office Action of US Related, U.S. Appl. No. 14/257,012", dated Nov. 16, 2017, p. 1-p. 13, in which the listed references (US patent application No. 1-3) were cited.

"Office Action of Taiwan Related Application, application No. 106115426", dated Sep. 19, 2017, p. 1-p. 3, in which the listed references (US patent application No. 4) were cited.

"Office Action of JP Related Application, application No. 2017-093911", dated Mar. 6, 2018, p. 1-p. 3, in which the listed references were cited.

"Office Action of Taiwan Related Application, application No. 105143135", dated Dec. 25, 2017, p. 1-p. 12, in which the listed references were cited.

"Office Action of Taiwan Related Application, application No. 106140004", dated Feb. 5, 2018, p. 1-p. 5, in which the listed reference was cited.

"Office Action of US Related, U.S. Appl. No. 15/627,417", dated Feb. 23, 2018, p. 1-p. 26.

"Office Action of US Related, U.S. Appl. No. 15/499,913", dated Feb. 16, 2018, p. 1-p. 40.

"Office Action of US Related, U.S. Appl. No. 15/453,873", dated Mar. 5, 2018, p. 1-p. 9, in which the listed references were cited.

"Office Action of Related U.S. Appl. No. 15/723,117", dated Jul. 12, 2018, pp. 1-24.

"Office Action of Related U.S. Appl. No. 15/981,864", dated Jul. 16, 2018, pp. 1-21.

"Notice of allowance of Related U.S. Appl. No. 15/627,417", dated Jul. 19, 2018, pp. 1-22.

"Office Action of Related U.S. Appl. No. 15/453,873", dated Sep. 26, 2018, pp. 1-11.

* cited by examiner

SEMICONDUCTOR STRUCTURE

CROSS-REFERENCE TO RELATED APPLICATION

This application is a continuation-in-part application of and claims the priority benefit of U.S. prior application Ser. No. 14/727,786, filed on Jun. 1, 2015, now allowed. The prior U.S. prior application Ser. No. 14/727,786 is a continuation application of and claims the priority benefit of U.S. application Ser. No. 13/963,104, filed on Aug. 9, 2013, now patented as U.S. Pat. No. 9,048,364, issued on Jun. 2, 2015, which claims the priority benefit of Taiwan application serial no. 101143115, filed on Nov. 19, 2012. The entirety of each of the above-mentioned patent applications is hereby incorporated by reference herein and made a part of this specification.

BACKGROUND OF THE INVENTION

1. Field of the Invention

The present invention generally relates to a semiconductor structure, in particular, to a semiconductor structure including GaN based material.

2. Description of Related Art

In recent years, light emitting diodes (LED) have become more important in our daily lives due to their broad applications. LED is going to replace most of lighting devices available now and becoming a solid lighting element for the next generation. It's a trend to develop high energy saving, high efficiency and high power LED. Nitride LED has become one of the most popular optoelectronic semiconductor materials due to the advantages of compact volume, mercury-free, high efficiency and long service life. The wavelength of III-nitride almost covers the wavelength range of visible light so that it is a LED material with great potential.

Generally, a gallium nitride-based (GaN-based) semiconductor has been widely used in a blue/green light emitting diode. Also, an active layer of the light emitting device generally includes well layers and barrier layers, and a light emitting device including an InGaN well layer can be used to emit near ultraviolet light.

Since light produced in the well layer is emitted to the outside through a barrier layer and a contact layer, a plurality of semiconductor layer is located in a path along which light travels. Therefore, it is necessary to control light absorption and the electrical transmission of the semiconductor layers.

SUMMARY OF THE INVENTION

Accordingly, the present invention is directed to a semiconductor structure having high light emitting efficiency and high electrical conductivity.

For achieving the foregoing at least one of the purpose or the other purposes, in one embodiment of the present invention, a semiconductor structure includes a first-type doped semiconductor layer, a light emitting layer, a second-type doped semiconductor layer comprising $Al_xIn_yGa_{1-x-y}N$ layers, at least one GaN based layer, and an ohmic contact layer. The light emitting layer is disposed on the first-type doped semiconductor layer, and the second-type doped semiconductor layer is disposed on the light emitting layer. The $Al_xIn_yGa_{1-x-y}N$ layers are stacked on the light emitting layer, where $0<x<1$, $0\leq y<1$, and $0<x+y<1$, and the GaN based layer is interposed between two of the $Al_xIn_yGa_{1-x-y}N$ layers, and the ohmic contact layer is disposed on the $Al_xIn_yGa_{1-x-y}N$ layers.

In one embodiment of the present invention, the $Al_xIn_yGa_{1-x-y}N$ layers include: an AlInGaN based stress control layer, and an AlGaN based carrier blocking layer. The AlInGaN based stress control layer is disposed between the light emitting layer and the AlGaN based carrier blocking layer.

In one embodiment of the present invention, the AlInGaN based stress control layer is doped with a second-type dopant at a concentration higher than $10^{19}$ cm$^{-3}$.

In one embodiment of the present invention, the $Al_xIn_yGa_{1-x-y}N$ layers include: a first AlInGaN based layer disposed on light emitting layer, and a second AlInGaN based layer disposed on the first AlInGaN based layer. The first AlInGaN based layer is doped with carbon (C).

In one embodiment of the present invention, the first AlInGaN based layer is doped with carbon (C) at a concentration higher than $5\times10^{17}$ cm$^{-3}$.

In one embodiment of the present invention, the second AlInGaN based layer contains hydrogen (H) at a concentration higher than $10^{18}$ cm$^{-3}$.

In one embodiment of the present invention, the light emitting layer includes a first-type dopant at a concentration higher than $10^{17}$ cm$^{-3}$.

In one embodiment of the present invention, the light emitting layer includes a multiple quantum well (MQW) structure. The MQW structure includes a plurality of well layers and a plurality of barrier layers stacked alternately, and a concentration of indium (In) in one of the $Al_xIn_yGa_{1-x-y}N$ layers is smaller than a concentration of indium (In) in each of the well layers of the MQW structure.

In one embodiment of the present invention, the GaN based layer includes a second-type dopant at a first concentration, and the $Al_xIn_yGa_{1-x-y}N$ layers include the second-type dopant at a second concentration, and the first concentration is higher than the second concentration.

In one embodiment of the present invention, the semiconductor structure further includes a substrate. The first-type doped semiconductor layer is disposed on the substrate and is disposed between the light emitting layer and the substrate.

In one embodiment of the present invention, the semiconductor structure further includes a superlattice layer disposed between the light emitting layer and the first-type doped semiconductor layer.

For achieving the foregoing at least one of the purpose or the other purposes, in one embodiment of the present invention, a semiconductor structure includes a first-type doped semiconductor layer, a light emitting layer, and a second-type doped semiconductor layer comprising a first AlInGaN based layer, a second AlInGaN based layer, at least one GaN based layer, and an ohmic contact layer. The light emitting layer is disposed on the first-type doped semiconductor layer and includes silicon (Si) as a dopant at a concentration higher than $10^{17}$ cm$^{-3}$. The second-type doped semiconductor layer is disposed on the light emitting layer. The first AlInGaN based layer is disposed on light emitting layer and doped with carbon (C). The second AlInGaN based layer is disposed on the first AlInGaN based layer, and the GaN based layer is interposed between the first AlInGaN based layer and the second AlInGaN based layer. The ohmic contact layer is disposed on the second AlInGaN based layer.

In one embodiment of the present invention, the first AlInGaN based layer is doped with carbon (C) at a concentration higher than $5 \times 10^{17}$ cm$^{-3}$.

In one embodiment of the present invention, the second AlInGaN based layer contains hydrogen (H) at a concentration higher than $10^{18}$ cm$^{-3}$.

In one embodiment of the present invention, the light emitting layer includes a multiple quantum well (MQW) structure, the MQW structure includes a plurality of well layers and a plurality of barrier layers stacked alternately, and a concentration of indium (In) in the first AlInGaN based layer is smaller than a concentration of indium (In) in each of the well layers of the MQW structure.

In one embodiment of the present invention, the light emitting layer includes a multiple quantum well (MQW) structure, the MQW structure includes a plurality of well layers and a plurality of barrier layers stacked alternately, and a concentration of indium (In) in the second AlInGaN based layer is smaller than a concentration of indium (In) in each of the well layers of the MQW structure.

In one embodiment of the present invention, the GaN based layer includes a second-type dopant at a first concentration, and the first or the second AlInGaN based layer includes the second-type dopant at a second concentration, wherein the first concentration is higher than the second concentration.

In one embodiment of the present invention, the semiconductor structure further includes a substrate. The first-type doped semiconductor layer is disposed on the substrate and is disposed between the light emitting layer and the substrate.

In one embodiment of the present invention, the semiconductor structure further includes a superlattice layer disposed between the light emitting layer and the first-type doped semiconductor layer.

Based on the forgoing description, there is at least one of the advantages as being described below for the embodiments of the invention. In the embodiment of the invention, the GaN based layer is interposed between two of the Al$_x$In$_y$Ga$_{1-x-y}$N layers on the light emitting layer of the semiconductor structure, and the ohmic contact layer is disposed on the Al$_x$In$_y$Ga$_{1-x-y}$N layers. Therefore, when the light emitting layer emits light, the transmittance and the electrical conductivity of the second-type doped semiconductor layer including the GaN based layer and the ohmic contact layer is increased, so as to improve the light emitting efficiency of the semiconductor structure.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
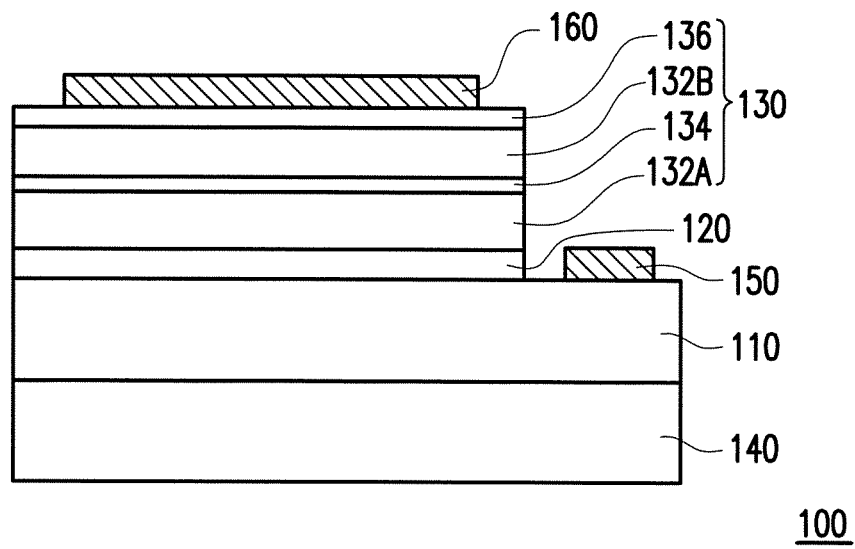
FIG. 1 illustrates a sectional view of a semiconductor structure according to the first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

In the following embodiments, when it is mentioned that a layer of something (or membrane) or a structure is disposed over or under a substrate, another layer of something (or membrane), or another structure, that means the two structures, the layers of something (or membranes), the layer of something and the substrate, or the structure and the substrate can be directly or indirectly connected. The indirect connection means there is at least one intermediate layer disposed therebetween.

An embodiment of the present invention provides a semiconductor structure being configured to emit light, and the light emitting efficiency and the electrical conductivity of the semiconductor structure are both improved. In other words, the semiconductor structure is a light emitting semiconductor structure, and the light emitting semiconductor has good light emitting efficiency over spectrum of, for example, blue light and near-UV light.

FIG. 1 is a sectional view of a semiconductor structure according to the first embodiment of the present invention. Referring to FIG. 1, semiconductor structure 100 includes first-type doped semiconductor layer 110, light emitting layer 120, and second-type doped semiconductor layer 130. The light emitting layer 120 is disposed on the first-type doped semiconductor layer 110, and the second-type doped semiconductor layer 130 is disposed on the light emitting layer 120. The second-type doped semiconductor layer 130 includes Al$_x$In$_y$Ga$_{1-x-y}$N layers 132A, 132B, where $0<x<1$, $0\leq y<1$, and $0<x+y<1$, a GaN based layer 134, and an ohmic contact layer 136. The Al$_x$In$_y$Ga$_{1-x-y}$N layers 132A, 132B are stacked on the light emitting layer 120, and the GaN based layer 134 is interposed between the Al$_x$In$_y$Ga$_{1-x-y}$N layers 132A and the Al$_x$In$_y$Ga$_{1-x-y}$N layers 132B, and the ohmic contact layer 136 is disposed on the Al$_x$In$_y$Ga$_{1-x-y}$N layers 132A, 132B. In other words, in the semiconductor structure 100, the Al$_x$In$_y$Ga$_{1-x-y}$N layers 132A, 132B are placed between the light emitting layer 120 and the ohmic contact layer 136, and the GaN based layer 134 is placed at an intervening position of the Al$_x$In$_y$Ga$_{1-x-y}$N layers 132A, 132B.

The GaN based layer 134 between the Al$_x$In$_y$Ga$_{1-x-y}$N layers 132A, 132B can improve the electrical connection of the semiconductor structure 100. Also, the ohmic contact layer 136 disposed on the Al$_x$In$_y$Ga$_{1-x-y}$N layers 132A, 132B can also improve the electrical connection of the semiconductor structure 100 and the resistance reduction of the semiconductor structure 100. Therefore, the semiconductor structure 100 can provide high light emitting efficiency and high electrical conductivity.

In details, the semiconductor structure 100 further includes a first electrode 150 disposed on the first-type doped semiconductor layer 110 and a second electrode 160 disposed on the second-type doped semiconductor layer 130, so as to provide the electricity to the first-type doped semiconductor layer 110 and the second-type doped semiconductor layer 130.

The semiconductor structure 100 further includes a substrate 140, and the first-type doped semiconductor layer 110 is disposed between the substrate 140 and the light emitting layer 120. To be specific, the semiconductor structure 100 is used for a flip-chip connection, or a wire bonding connection, for example, but the invention is not limited thereto.

The substrate 140 of this embodiment is a substrate for growing a GaN-based semiconductor structure, and includes a sapphire substrate, a Si substrate, an AlN substrate, or a SiC substrate, but without being limited thereto.

The first-type doped semiconductor layer 110 of the first embodiment is an n-type doped semiconductor layer, for example. To be more specific, the first-type doped semiconductor layer 110 may be an n-type impurity-doped semiconductor layer, for example, Si-doped GaN-based semiconductor, and may be formed to a thickness of about 1~3 μm, but without being limited thereto.

The light emitting layer 120 of the semiconductor structure 100 of the embodiment includes a first-type dopant at a concentration higher than $10^{17}$ cm$^{-3}$. To be more specific, the light emitting layer 120 may be an n-type impurity-doped light emitting layer, for example, Si-doped, but without being limited thereto, and the light emitting layer 120 is configured to emit light having wavelength falling into a range from UV, purple, blue to green.

Figure 2:
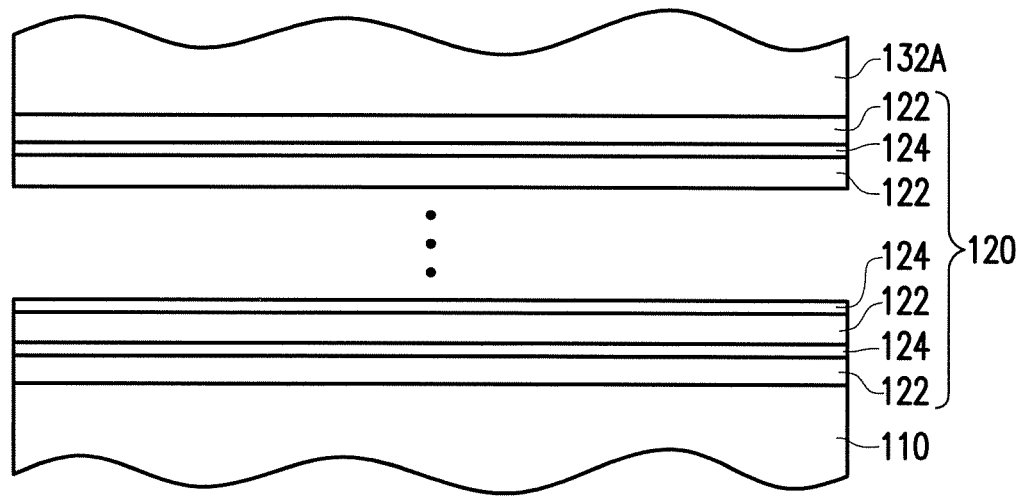
FIG. 2 is a sectional view of active layer of the semiconductor structure according to the first embodiment of the present invention.

FIG. 2 is a sectional view of active layer of the semiconductor structure according to the first embodiment of the present invention. In details, referring to FIG. 2, the light emitting layer 120 includes a MQW structure, and the MQW structure includes a plurality of well layers 124 and a plurality of barrier layers 122 stacked alternately, and a concentration of indium (In) in one of the $Al_xIn_yGa_{1-x-y}N$ layers 132A, 132B is smaller than a concentration of indium (In) in each of the well layers 124 of the MQW structure, but without being limited thereto. Therefore, the forward voltage for the semiconductor structure 100 can be reduced.

The second-type doped semiconductor layer 130 of the first embodiment is a p-type doped semiconductor layer, for example. To be more specific, the second-type doped semiconductor layer 130 may be a p-type impurity-doped semiconductor layer, for example, Mg-doped GaN-based semiconductor, and may be formed to a thickness of about 10 nm-200 nm, but without being limited thereto.

In the second-type doped semiconductor layer 130, the $Al_xIn_yGa_{1-x-y}N$ layer 132B is located above the $Al_xIn_yGa_{1-x-y}N$ layer 132A. The $Al_xIn_yGa_{1-x-y}N$ layer 132A located between the light emitting layer 120 and the $Al_xIn_yGa_{1-x-y}N$ layer 132B is an Al, In-containing GaN based layer doped with carbon (C).

To be specific, the $Al_xIn_yGa_{1-x-y}N$ layer 132A is doped with carbon (C) at a concentration higher than $5\times10^{17}$ cm$^{-3}$, and the $Al_xIn_yGa_{1-x-y}N$ layer 132B is doped with hydrogen (H) at a concentration higher than $10^{18}$ cm$^{-3}$, but without being limited thereto. Therefore, the hole concentration can be increased.

In the second-type doped semiconductor layer 130 of this embodiment, the GaN based layer 134 includes a second-type dopant at a first concentration, and the $Al_xIn_yGa_{1-x-y}N$ layers 132A, 132B include the second-type dopant at a second concentration, and the first concentration is higher than the second concentration. In details, the GaN based layer 134 includes a p-type dopant at a higher concentration, and the $Al_xIn_yGa_{1-x-y}N$ layers 132A, 132B include the p-type dopant at a lower concentration, and the p-type dopant is Mg, for example.

Also, the GaN based layer 134 may be formed to a thickness of about 1-50 nm, but without being limited thereto. Therefore, the GaN based layer 134 not only can improve the electrical connection of the semiconductor structure 100, but the light absorption of the second-typed doped semiconductor layer 130 can be properly controlled.

In the second-type doped semiconductor layer 130 of this embodiment, the material of the ohmic contact layer 136 includes but not limited to nickel (Ni), indium tin oxide (ITO), indium zinc oxide (IZO) or gallium zinc oxide (GZO) etc., so as to improve the electrical connection between the second electrode 160 and the rest of the semiconductor structure 100.

Figure 3:
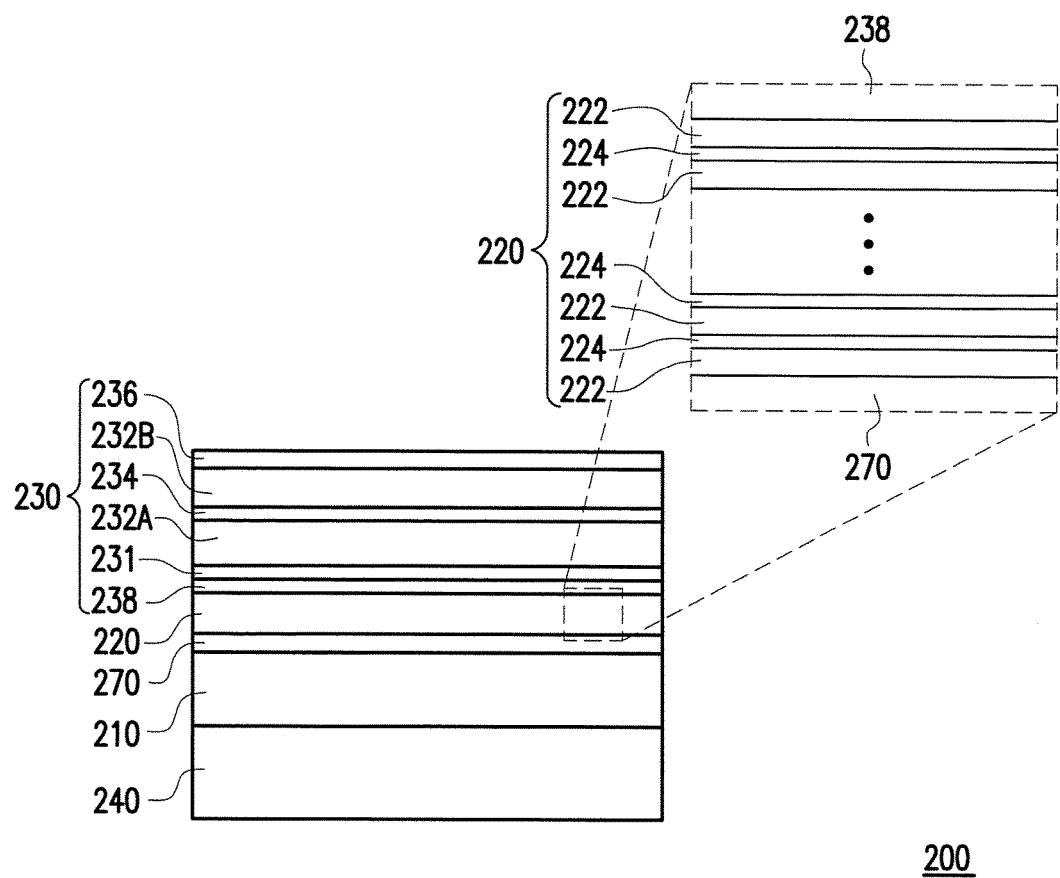
FIG. 3 illustrates a sectional view of a semiconductor structure and an active layer thereof according to the second embodiment of the present invention.

FIG. 3 illustrates a sectional view of a semiconductor structure and an active layer thereof according to the second embodiment of the present invention. Referring to FIG. 3, semiconductor structure 200 of the embodiment includes substrate 240, first-type doped semiconductor layer 210, superlattice layer 270, light emitting layer 220, and second-type doped semiconductor layer 230. The light emitting layer 220 is disposed on the first-type doped semiconductor layer 210, and the second-type doped semiconductor layer 230 is disposed on the light emitting layer 220. The second-type doped semiconductor layer 230 includes AlInGaN based stress control layer 238, AlGaN based carrier blocking layer 231, $Al_xIn_yGa_{1-x-y}N$ layer 232A, GaN based layer 234, $Al_xIn_yGa_{1-x-y}N$ layer 232B, and ohmic contact layer 236, where 0<x<1, 0≤y<1, and 0<x+y<1. The $Al_xIn_yGa_{1-x-y}N$ layer 232B is disposed on the $Al_xIn_yGa_{1-x-y}N$ layer 232A, and the GaN based layer 234 is interposed between the $Al_xIn_yGa_{1-x-y}N$ layers 232A and the $Al_xIn_yGa_{1-x-y}N$ layers 232B, and the ohmic contact layer 236 is disposed on the $Al_xIn_yGa_{1-x-y}N$ layer 232B. In other words, in the semiconductor structure 200 of the embodiment, the $Al_xIn_yGa_{1-x-y}N$ layers 232A, 232B are placed between the light emitting layer 220 and the ohmic contact layer 236, and the GaN based layer 234 is placed at an intervening position of the $Al_xIn_yGa_{1-x-y}N$ layers 232A and 232B.

The substrate 240 of this embodiment is a substrate for growing a GaN-based semiconductor structure, and includes a sapphire substrate, an AlN substrate, a Si substrate, or a SiC substrate, but without being limited thereto.

The first-type doped semiconductor layer 210 of the second embodiment is an n-type doped semiconductor layer, for example. To be more specific, the first-type doped semiconductor layer 210 of this embodiment may be an n-type impurity-doped semiconductor layer, for example, Si-doped GaN-based semiconductor, and may be formed to a thickness of about 1~3 μm, but without being limited thereto.

The superlattice layer 270 of the semiconductor structure 200 is disposed between the light emitting layer 220 and the first-type doped semiconductor layer 210, and the superlattice layer 270 may be formed by alternately stacking first and second InAlGaN layers having different compositions in about 2~40 cycles, but without being limited thereto. The superlattice layer 270 is formed beside the light emitting layer 220, so as to reduce the current leakage of the semiconductor structure 200.

The light emitting layer 220 of the semiconductor structure 200 of the embodiment includes a first-type dopant at a concentration higher than $10^{17}$ cm$^{-3}$. To be more specific, the light emitting layer 220 may be an n-type impurity-doped light emitting layer, for example, Si-doped, but without being limited thereto, and the light emitting layer 220 is configured to emit light having wavelength fall into a range from UV, purple, blue to green. In details, the light emitting layer 220 includes a MQW structure, the MQW structure includes a plurality of well layers 224 and a plurality of barrier layers 222 stacked alternately, and a concentration of indium (In) in one of the $Al_xIn_yGa_{1-x-y}N$ layers 232A, 232B is smaller than a concentration of indium (In) in each of the well layers 224 of the MQW structure, without being limited thereto. Therefore, the forward voltage for the semiconductor structure 200 can be reduced.

The AlInGaN based stress control layer 238 is disposed between the light emitting layer 220 and the AlGaN based carrier blocking layer 231, and the AlInGaN based stress control layer 238 is doped with a second-type dopant at a concentration higher than $10^{19}$ cm$^{-3}$. To be more specific, the AlInGaN base stress control layer 238 is doped with p-type dopant, and the p-type dopant is Mg, for example. Therefore, the stress control layer 238 located on the light emitting layer 220 can relieve the lattice mismatch between the well layers 224 and the barrier layers 222 of the light emitting layer 220.

The AlGaN based carrier blocking layer 231 is place between the light emitting layer 220 and the Al$_x$In$_y$Ga$_{1-x-y}$N layer 232A, so as to relieve the lattice mismatch between the light emitting layer 220 and the rest of the second-type doped semiconductor layer 230.

The first AlInGaN based layer 232A of the embodiment is doped with carbon (C), and the AlInGaN based layer 232B of the embodiment is doped with hydrogen (H). To be specific, the Al$_x$In$_y$Ga$_{1-x-y}$N layer 232A is an Al, In-containing GaN based layer doped with carbon (C) at a concentration higher than $5 \times 10^{17}$ cm$^{-3}$, and the Al$_x$In$_y$Ga$_{1-x-y}$N layer 232B is an Al, In-containing GaN based layer doped with hydrogen (H) at a concentration higher than $10^{18}$ cm$^{-3}$, but without being limited thereto. Therefore, the hole concentration can be increased.

In the second-type doped semiconductor layer 230 of this embodiment, the GaN based layer 234 includes a second-type dopant at a first concentration, and the Al$_x$In$_y$Ga$_{1-x-y}$N layers 232A, 232B include the second-type dopant at a second concentration, and the first concentration is higher than the second concentration. In details, the GaN based layer 234 includes a p-type dopant at a higher concentration, and the Al$_x$In$_y$Ga$_{1-x-y}$N layers 232A, 232B are AlInGaN based layers including the p-type dopant at a lower concentration, and the p-type dopant is Mg, for example.

Also, the ratio of the thickness of the GaN based layer 234 to the total thickness of the second-type doped semiconductor layer is lower than or equal to 0.5, but without being limited thereto. Therefore, the GaN based layer 234 not only can improve the electrical connection of the semiconductor structure 200, but the light absorption of the second-typed doped semiconductor layer 130 can be properly controlled.

In summary, the embodiments of the invention have at least one of the advantages below. In the embodiments of the invention, the second-type doped semiconductor layer of the semiconductor structure includes Al$_x$In$_y$Ga$_{1-x-y}$N layers and GaN based layer, and the GaN based layers is interposed between the Al$_x$In$_y$Ga$_{1-x-y}$N layers, and the GaN based layer and the Al$_x$In$_y$Ga$_{1-x-y}$N are stacked on the light emitting layer of the semiconductor structure, and an ohmic contact layer is disposed on the Al$_x$In$_y$Ga$_{1-x-y}$N layers and GaN based layer. Therefore, when the light emitting layer emits blue light or near-UV light, the Al$_x$In$_y$Ga$_{1-x-y}$N layers can improve the transmittance and provide a carrier blocking function in the second-type doped semiconductor layer, and the electrical conductivity of the second-type doped semiconductor layer is increased by the GaN based layer, so as to improve the light emitting efficiency of the semiconductor structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor structure comprising:
a first-type doped semiconductor layer;
a light emitting layer disposed on the first-type doped semiconductor layer;
a second-type doped semiconductor layer disposed on the light emitting layer, the second-type doped semiconductor layer comprising:
a plurality of Al$_x$In$_y$Ga$_{1-x-y}$N layers stacked on the light emitting layer, where $0<x<1$, $0\leq y<1$, and $0<x+y<1$;
at least one GaN based layer interposed between two of the Al$_x$In$_y$Ga$_{1-x-y}$N layers; and
an ohmic contact layer disposed on the Al$_x$In$_y$Ga$_{1-x-y}$N layers,
wherein the Al$_x$In$_y$Ga$_{1-x-y}$N layers comprises:
an AlInGaN based stress control layer; and
an AlGaN based carrier blocking layer, the AlInGaN based stress control layer being disposed between the light emitting layer and the AlGaN based carrier blocking layer.

2. The semiconductor structure as claimed in claim 1, wherein the AlInGaN based stress control layer is doped with a second-type dopant at a concentration higher than $10^{19}$ cm$^{-3}$.

3. The semiconductor structure as claimed in claim 1, wherein the Al$_x$In$_y$Ga$_{1-x-y}$N layers further comprises:
a first AlInGaN based layer disposed on light emitting layer, the first AlInGaN based layer being doped with carbon (C); and
a second AlInGaN based layer disposed on the first AlInGaN based layer.

4. The semiconductor structure as claimed in claim 3, wherein the first AlInGaN based layer is doped with carbon (C) at a concentration higher than $5 \times 10^{17}$ cm$^{-3}$.

5. The semiconductor structure as claimed in claim 3, wherein the second AlInGaN based layer contains hydrogen (H) at a concentration higher than $10^{18}$ cm$^{-3}$.

6. The semiconductor structure as claimed in claim 1, wherein the light emitting layer comprises a first-type dopant at a concentration higher than $10^{17}$ cm$^{-3}$.

7. The semiconductor structure as claimed in claim 1, wherein the light emitting layer comprises a multiple quantum well (MQW) structure, the MQW structure comprises a plurality of well layers and a plurality of barrier layers stacked alternately, and a concentration of indium (In) in one of the Al$_x$In$_y$Ga$_{1-x-y}$N layers is smaller than a concentration of indium (In) in each of the well layers of the MQW structure.

8. The semiconductor structure as claimed in claim 1, wherein the GaN based layer comprises a second-type dopant at a first concentration, the Al$_x$In$_y$Ga$_{1-x-y}$N layers comprise the second-type dopant at a second concentration, and the first concentration is higher than the second concentration.

9. The semiconductor structure as claimed in claim 1 further comprising a substrate, wherein the first-type doped semiconductor layer is disposed on the substrate and is between the light emitting layer and the substrate.

10. The semiconductor structure as claimed in claim 1 further comprising a superlattice layer disposed between the light emitting layer and the first-type doped semiconductor layer.

11. A semiconductor structure comprising:
a first-type doped semiconductor layer;
a light emitting layer disposed on the first-type doped semiconductor layer, the light emitting layer comprising silicon (Si) at a concentration higher than $10^{17}$ cm$^{-3}$; and a second-type doped semiconductor layer disposed on the light emitting layer, the second-type doped semiconductor layer comprising:
a first AlInGaN based layer disposed on light emitting layer, the first AlInGaN based layer being doped with carbon (C);
a second AlInGaN based layer disposed on the first AlInGaN based layer;
at least one GaN based layer interposed between the first AlInGaN based layer and the second AlInGaN based layer; and
an ohmic contact layer disposed on the second AlInGaN based layer.

12. The semiconductor structure as claimed in claim 11, wherein the first AlInGaN based layer is doped with carbon (C) at a concentration higher than $5 \times 10^{17}$ cm$^{-3}$.

13. The semiconductor structure as claimed in claim 11, wherein the second AlInGaN based layer contains hydrogen (H) at a concentration higher than $10^{18}$ cm$^{-3}$.

14. The semiconductor structure as claimed in claim 11, wherein the light emitting layer comprises a multiple quantum well (MQW) structure, the MQW structure comprises a plurality of well layers and a plurality of barrier layers stacked alternately, and a concentration of indium (In) in the first AlInGaN based layer is smaller than a concentration of indium (In) in each of the well layers of the MQW structure.

15. The semiconductor structure as claimed in claim 11, wherein the light emitting layer comprises a multiple quantum well (MQW) structure, the MQW structure comprises a plurality of well layers and a plurality of barrier layers stacked alternately, and a concentration of indium (In) in the second AlInGaN based layer is smaller than a concentration of indium (In) in each of the well layers of the MQW structure.

16. The semiconductor structure as claimed in claim 11, wherein the GaN based layer comprises a second-type dopant at a first concentration, the first or second AlInGaN based layer comprises the second-type dopant at a second concentration, and the first concentration is higher than the second concentration.

17. The semiconductor structure as claimed in claim 11 further comprising a substrate, wherein the first-type doped semiconductor layer is disposed on the substrate and is between the light emitting layer and the substrate.

18. The semiconductor structure as claimed in claim 11 further comprising a superlattice layer disposed between the light emitting layer and the first-type doped semiconductor layer.

19. A semiconductor structure comprising:
a first-type doped semiconductor layer;
a light emitting layer disposed on the first-type doped semiconductor layer;
a second-type doped semiconductor layer disposed on the light emitting layer, the second-type doped semiconductor layer comprising:
a plurality of $Al_xIn_yGa_{1-x-y}N$ layers stacked on the light emitting layer, where $0<x<1$, $0\leq y<1$, and $0<x+y<1$;
at least one GaN based layer interposed between two of the $Al_xIn_yGa_{1-x-y}N$ layers; and
an ohmic contact layer disposed on the $Al_xIn_yGa_{1-x-y}N$ layers,
wherein the $Al_xIn_yGa_{1-x-y}N$ layers comprises:
a first AlInGaN based layer disposed on light emitting layer, the first AlInGaN based layer being doped with carbon (C); and
a second AlInGaN based layer disposed on the first AlInGaN based layer.

20. The semiconductor structure as claimed in claim 19, wherein the $Al_xIn_yGa_{1-x-y}N$ layers further comprises:
an AlInGaN based stress control layer; and
an AlGaN based carrier blocking layer, the AlInGaN based stress control layer being disposed between the light emitting layer and the AlGaN based carrier blocking layer, and the AlInGaN based stress control layer is doped with a second-type dopant at a concentration higher than $10^{19}$ cm$^{-3}$.

21. The semiconductor structure as claimed in claim 19, wherein the first AlInGaN based layer is doped with carbon (C) at a concentration higher than $5 \times 10^{17}$ cm$^{-3}$.

22. The semiconductor structure as claimed in claim 19, wherein the second AlInGaN based layer contains hydrogen (H) at a concentration higher than $10^{18}$ cm$^{-3}$.

23. The semiconductor structure as claimed in claim 19, wherein the light emitting layer comprises a first-type dopant at a concentration higher than $10^{17}$ cm$^{-3}$.

24. The semiconductor structure as claimed in claim 19, wherein the light emitting layer comprises a multiple quantum well (MQW) structure, the MQW structure comprises a plurality of well layers and a plurality of barrier layers stacked alternately, and a concentration of indium (In) in one of the $Al_xIn_yGa_{1-x-y}N$ layers is smaller than a concentration of indium (In) in each of the well layers of the MQW structure.

25. The semiconductor structure as claimed in claim 19, wherein the GaN based layer comprises a second-type dopant at a first concentration, the $Al_xIn_yGa_{1-x-y}N$ layers comprise the second-type dopant at a second concentration, and the first concentration is higher than the second concentration.

26. The semiconductor structure as claimed in claim 19 further comprising a substrate, wherein the first-type doped semiconductor layer is disposed between the light emitting layer and the substrate.

27. The semiconductor structure as claimed in claim 19 further comprising a superlattice layer disposed between the light emitting layer and the first-type doped semiconductor layer.

28. A semiconductor structure comprising:
a first-type doped semiconductor layer;
a light emitting layer disposed on the first-type doped semiconductor layer;
a second-type doped semiconductor layer disposed on the light emitting layer, the second-type doped semiconductor layer comprising:
a plurality of $Al_xIn_yGa_{1-x-y}N$ layers stacked on the light emitting layer, where $0<x<1$, $0\leq y<1$, and $0<x+y<1$;
at least one GaN based layer interposed between two of the $Al_xIn_yGa_{1-x-y}N$ layers; and
an ohmic contact layer disposed on the $Al_xIn_yGa_{1-x-y}N$ layers,
wherein the light emitting layer comprises a multiple quantum well (MQW) structure, the MQW structure comprises a plurality of well layers and a plurality of barrier layers stacked alternately, and a concentration of indium (In) in one of the $Al_xIn_yGa_{1-x-y}N$ layers is smaller than a concentration of indium (In) in each of the well layers of the MQW structure.

29. The semiconductor structure as claimed in claim 28, wherein the $Al_xIn_yGa_{1-x-y}N$ layers comprises:
an AlInGaN based stress control layer; and
an AlGaN based carrier blocking layer, the AlInGaN based stress control layer being disposed between the light emitting layer and the AlGaN based carrier blocking layer, and the AlInGaN based stress control layer is doped with a second-type dopant at a concentration higher than $10^{19}$ cm$^{-3}$.

30. The semiconductor structure as claimed in claim 28, wherein the Al$_x$In$_y$Ga$_{1-x-y}$N layers comprises:
a first AlInGaN based layer disposed on light emitting layer, the first AlInGaN based layer being doped with carbon (C); and
a second AlInGaN based layer disposed on the first AlInGaN based layer,
wherein the first AlInGaN based layer is doped with carbon (C) at a concentration higher than $5\times10^{17}$ cm$^{-3}$.

31. The semiconductor structure as claimed in claim 28, wherein the Al$_x$In$_y$Ga$_{1-x-y}$N layers comprises:
a first AlInGaN based layer disposed on light emitting layer, the first AlInGaN based layer being doped with carbon (C); and
a second AlInGaN based layer disposed on the first AlInGaN based layer,
wherein the second AlInGaN based layer contains hydrogen (H) at a concentration higher than $10^{18}$ cm$^{-3}$.

32. The semiconductor structure as claimed in claim 28, wherein the light emitting layer comprises a first-type dopant at a concentration higher than $10^{17}$ cm$^{-3}$.

33. The semiconductor structure as claimed in claim 28, wherein the GaN based layer comprises a second-type dopant at a first concentration, the Al$_x$In$_y$Ga$_{1-x-y}$N layers comprise the second-type dopant at a second concentration, and the first concentration is higher than the second concentration.

34. The semiconductor structure as claimed in claim 28 further comprising a substrate, wherein the first-type doped semiconductor layer is disposed between the light emitting layer and the substrate.

35. The semiconductor structure as claimed in claim 28 further comprising a superlattice layer disposed between the light emitting layer and the first-type doped semiconductor layer.

36. A semiconductor structure comprising:
a first-type doped semiconductor layer;
a light emitting layer disposed on the first-type doped semiconductor layer;
a second-type doped semiconductor layer disposed on the light emitting layer, the second-type doped semiconductor layer comprising:
a plurality of Al$_x$In$_y$Ga$_{1-x-y}$N layers stacked on the light emitting layer, where $0<x<1$, $0\leq y<1$, and $0<x+y<1$;
at least one GaN based layer interposed between two of the Al$_x$In$_y$Ga$_{1-x-y}$N layers; and
an ohmic contact layer disposed on the Al$_x$In$_y$Ga$_{1-x-y}$N layers,
wherein the GaN based layer comprises a second-type dopant at a first concentration, the Al$_x$In$_y$Ga$_{1-x-y}$N layers comprise the second-type dopant at a second concentration, and the first concentration is higher than the second concentration.

37. The semiconductor structure as claimed in claim 36, wherein the Al$_x$In$_y$Ga$_{1-x-y}$N layers comprises:
an AlInGaN based stress control layer; and
an AlGaN based carrier blocking layer, the AlInGaN based stress control layer being disposed between the light emitting layer and the AlGaN based carrier blocking layer, and the AlInGaN based stress control layer is doped with a second-type dopant at a concentration higher than $10^{19}$ cm$^{-3}$.

38. The semiconductor structure as claimed in claim 36, wherein the Al$_x$In$_y$Ga$_{1-x-y}$N layers comprises:
a first AlInGaN based layer disposed on light emitting layer, the first AlInGaN based layer being doped with carbon (C); and
a second AlInGaN based layer disposed on the first AlInGaN based layer,
wherein the first AlInGaN based layer is doped with carbon (C) at a concentration higher than $5\times10^{17}$ cm$^{-3}$.

39. The semiconductor structure as claimed in claim 36, wherein the Al$_x$In$_y$Ga$_{1-x-y}$N layers comprises:
a first AlInGaN based layer disposed on light emitting layer, the first AlInGaN based layer being doped with carbon (C); and
a second AlInGaN based layer disposed on the first AlInGaN based layer,
wherein the second AlInGaN based layer contains hydrogen (H) at a concentration higher than $10^{18}$ cm$^{-3}$.

40. The semiconductor structure as claimed in claim 36, wherein the light emitting layer comprises a first-type dopant at a concentration higher than $10^{17}$ cm$^{-3}$.

41. The semiconductor structure as claimed in claim 36 further comprising a substrate, wherein the first-type doped semiconductor layer is disposed between the light emitting layer and the substrate.

42. The semiconductor structure as claimed in claim 36 further comprising a superlattice layer disposed between the light emitting layer and the first-type doped semiconductor layer.

* * * * *